US00RE35121E

United States Patent [19]

Olivo et al.

[11] E Patent Number: Re. 35,121

[45] Reissued Date of Patent: Dec. 12, 1995

[54] REGULATION OF THE OUTPUT VOLTAGE OF A VOLTAGE MULTIPLIER

[75] Inventors: Marco Olivo, Bergamo; Luigi Pascucci, Sesto S. Giovanni; Corrado Villa, Sovico, all of Italy

[73] Assignee: SGS-Thomson Microelectronics S.r.l., Italy

[21] Appl. No.: 897,443

[22] Filed: Jun. 9, 1992

Related U.S. Patent Documents

Reissue of:

[64] Patent No.: 4,933,827
Issued: Jun. 12, 1990
Appl. No.: 376,267
Filed: Jul. 6, 1989

[30] Foreign Application Priority Data

Jul. 6, 1988 [IT] Italy ..... 83647 A/88

[51] Int. Cl.[6] ..... H02M 7/25

[52] U.S. Cl. ..... 363/60; 320/1

[58] Field of Search ..... 363/59, 60, 61; 320/1; 307/264, 270, 109, 110

[56] References Cited

U.S. PATENT DOCUMENTS

| | | | |
|---|---|---|---|
| 4,250,414 | 2/1981 | Kirsch | 307/296 A |
| 4,302,804 | 11/1981 | Bader | 363/60 |
| 4,344,003 | 8/1982 | Harmon et al. | 307/296 A |
| 4,346,310 | 8/1982 | Carter | 307/264 |
| 4,450,515 | 5/1984 | Takemae et al. | 363/60 |
| 4,621,315 | 11/1986 | Vaughn et al. | 363/60 |

*Primary Examiner*—Steven L. Stephan
*Assistant Examiner*—Adolf Berhane
*Attorney, Agent, or Firm*—Richard K. Robinson; Lisa K. Jorgenson; Richard A. Bachand

[57] ABSTRACT

The regulation of the output voltage of a voltage multiplier driven by a ring oscillator, an inverter of which is substituted by a NOR gate for providing a terminal through which stopping the oscillation, is effected by controlling the oscillation frequency in function of the current delivered by the voltage multiplier by means of a transistor T1 working as a current generator connected in series with a regulating chain of series-connected diodes by biasing the gate of the transistor with a constant voltage Vref, thus imposing a reference current Iref through the transistor. The voltage signal across the transistor is fed to the input of a first inverter with a preset triggering threshold and the output signal of the inverter is fed through an amplifying and phase-regenerating stage to said terminal for stopping the oscillation of said NOR gate of the ring oscillator. When the discharge current through the regulating chain becomes greater than the imposed current Iref, across the transistor T1 a voltage signal develops which, beyond a certain threshold, determines the switching of the inverter and, through the amplifying and phase-regenerating stage, causes a stop of the oscillation which resumes only when conduction through the regulating chain stops. At steady state the oscillation frequency will result controlled so as to maintain constant the output voltage of the voltage multiplier and to limit the discharge current through the regulating chain thus limiting power consumption.

14 Claims, 2 Drawing Sheets

REGULATION OF THE OUTPUT VOLTAGE OF A VOLTAGE MULTIPLIER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a circuit for regulating the output voltage of a voltage multiplier which is particularly effective in reducing power consumption.

2. Description of the Prior Art

In integrated circuits when a higher voltage than the supply voltage of the device is required, as for example in EEPROM and EPROM type memory devices, a [peculiar circuit known as] voltage multiplier capable of producing an output voltage of several tens *of* Volts starting from an input supply voltage of about 5 Volts and of delivering a current of about *a* few tens [microampers] *of microamperes* is employed. This circuit is well known and described in literature and is commonly associated with an oscillator which produces two signals with a 180° phase-shift between them, necessary for driving electric charge transfer through the various stages of the voltage multiplier, each stage being formed essentially by a diode and by a capacitor, in a single direction from a supply terminal to an output capacitor across which the multiplied voltage is produced, and with control means of the output voltage for keeping it constant independently from the load and/or from changes of the supply voltage.

A complete voltage multiplier system which is commonly used in integrated circuits is depicted in FIG. 1.

In the diagram the three circuit blocks forming the system are depicted. The voltage multiplier is a four stage circuit, each stage being formed by a diode (diode connected transistor) and by a capacitor, connected so as to transfer the charge in a single direction from an input terminal to an output terminal thereof, i.e., from the supply terminal VCC to the output capacitor COUT. The oscillator generating the two driving signals phi 1 and phi 2, with a 180° phase difference for driving the voltage multiplier is a common ring-type oscillator, wherein one of the three inverters composing it is substituted by a Schmitt trigger in order to achieve a greater ring's gain, and a second inverter is substituted by a NOR gate in order to permit interruption of the oscillation by applying a logic stop signal to the C terminal. The regulation means of the output voltage of the voltage multiplier is, as customary, formed by a "chain" of series-connected diodes (diode-connected transistors) connected between the high voltage (HV) output terminal and ground; the output voltage being adjusted to a value corresponding to the sum of the threshold voltages of the diode-connected transistors forming the chain. Of course, the regulation means may also be implemented by means of one or more Zener diodes, or by one or more parasitic transistors, according to techniques which are well known to the skilled technician.

All these simple regulators which are commonly used for stabilizing the output voltage of a voltage multiplier, [being] the overall current delivered by such a circuit generally *being* very small, absorb a relatively significant portion of the current being delivered to the load, i.e. to the circuit which is supplied with the high voltage, without an excessive variation of the output voltage. Of course the current drawn by the regulating chain [is higher the more capable] *increases as the capability of* the voltage multiplier [is of delivering] *to deliver* current to it *increases*, and this largely depends upon the frequency of oscillation of the driving signals phi 1 and phi 2 and upon the capacitance of the "pumping" capacitors of the voltage multiplier.

Since the voltage multiplier must be designed so as to be capable of supplying at least the current required by the high voltage circuits fed under the worst operation situation which may be contemplated, the operating frequency of the oscillator must be set at least to a value sufficient to generate such a contemplated maximum current to be delivered. As a consequence, under any other different working situation, an unduly high frequency of oscillation inevitably produces a waste of energy because the excess current produced by the voltage multiplier is discharged to ground by the regulation means of the output voltage. Moreover, these output voltage regulation means, made in accordance with common techniques, may significantly modify the output voltage when the current absorption becomes too high and above all may increase the power consumption due to the oscillator switching itself, this power consumption becoming remarkable when the capacitances to be driven by the driving signals phi 1 and phi 2 produced by the oscillator sum up to several tens *of* picoFarads and when the oscillator frequency is about 5–6 MHz.

Though these high consumption conditions may not be encountered normally in correctly designed circuits and wherein the supply voltage VCC is sufficiently stable, the case is different when the supply voltage may vary, for example, from 2.5 V to 5.5 V, or in devices designed for operation with either one of two contemplated voltages, e.g. 3 and 5 V.

In these instances, once a minimum frequency compatible with a supply voltage of, for example, 2.5 V of the oscillator is set during designing, the frequency will be sensibly higher when the supply voltage is 5.5 V with a consequent sensible increase of the current delivered by the voltage multiplier and therefore of the power consumption in general.

OBJECTIVES AND SUMMARY OF THE INVENTION

The present invention has as an objective an improved circuit for regulating the output voltage of a voltage multiplier capable of effectively limiting the power consumption. The solution provided contemplates controlling the frequency of oscillation of the oscillator which generates the two driving signals phi 1 and phi 2 of the voltage multiplier circuit in function of the current delivered by the latter.

DESCRIPTION OF THE PREFERRED EMBODIMENT

Figure 1:
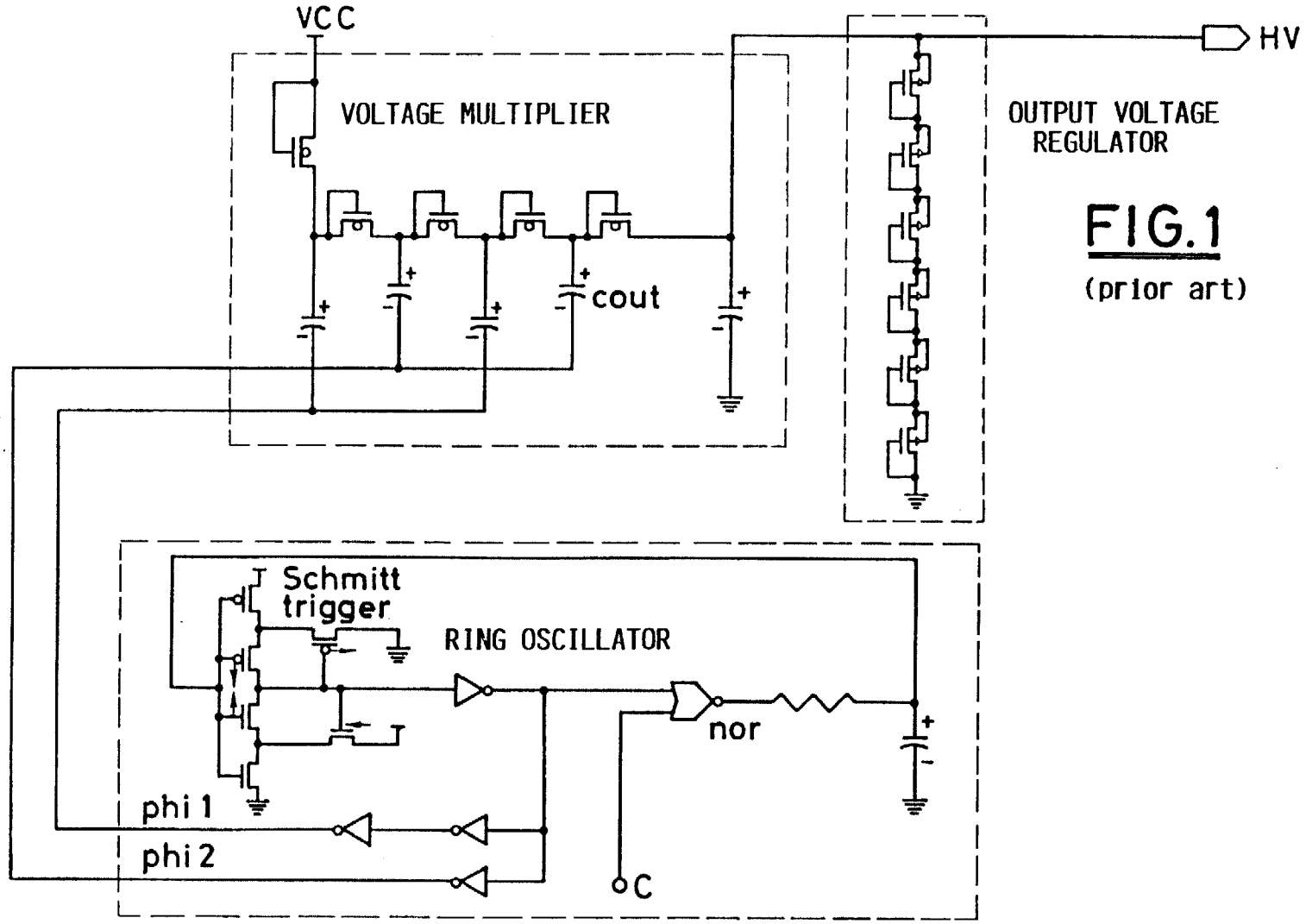
FIG. 1 (prior art)
FIG. 1 is a circuit diagram of a voltage multiplier system made in accordance with the prior art.
Figure 2:
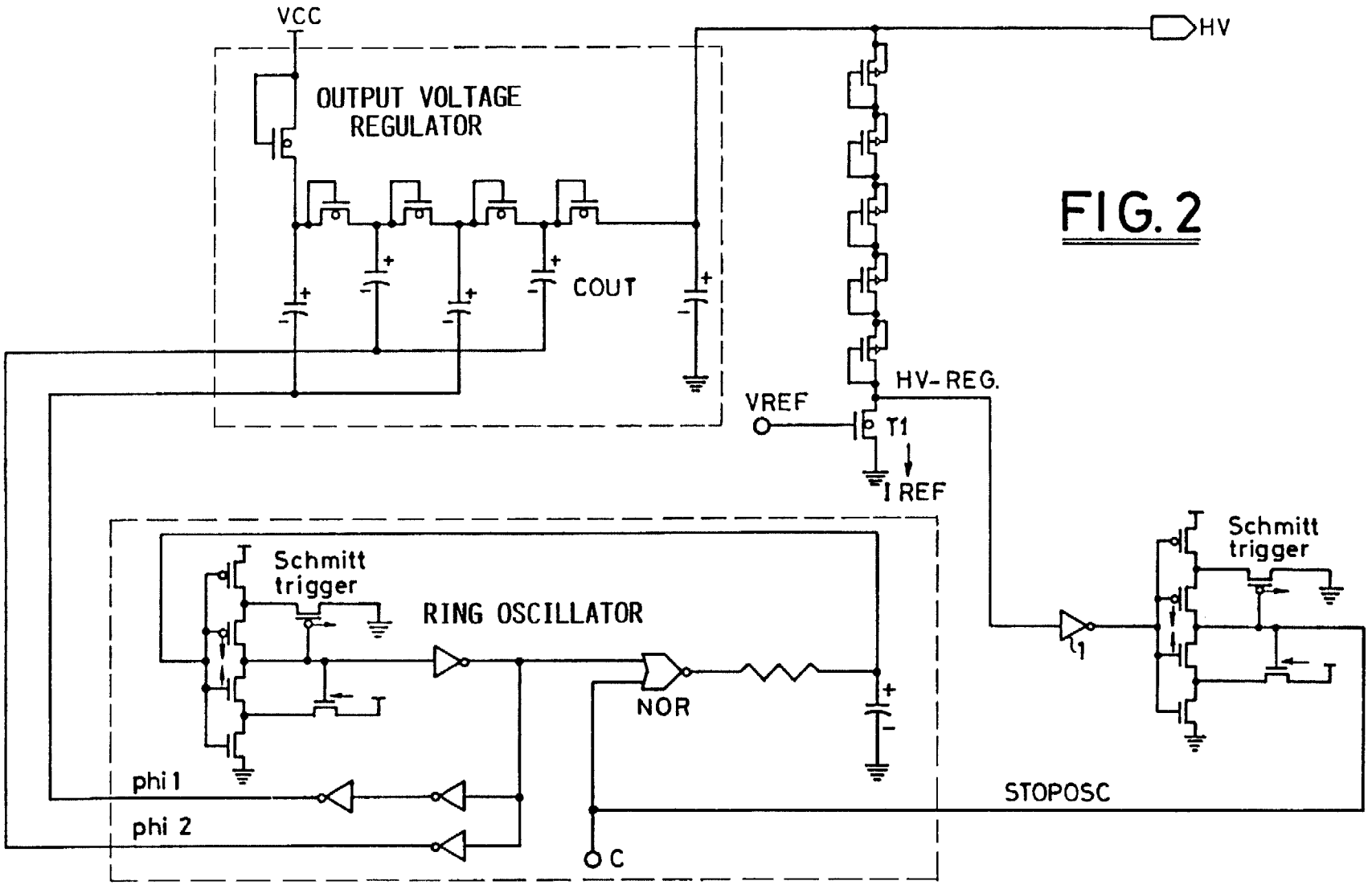
FIG. 2 is a circuit diagram of a voltage multiplier system made in accordance with the present invention.

The improved circuit of the invention for regulating the output voltage of a voltage [multipling] *multiplying* system for a supply voltage VCC is depicted in FIG. 2. The circuit blocks relative to the voltage multiplier circuit and to the ring oscillator driving it may be, as shown in FIG. 2, similar to those utilized in the prior art system as schematically depicted in FIG. 1.

By contrast, the regulating means of the HV output voltage of the voltage multiplier which, in the example shown, may be a chain of diode-connected transistors (p-channel transistors in the case depicted) presenting a total threshold voltage substantially equal to the regulated voltage desired, has a transistor T1, functioning as a current generator, whereby the Vgs (gate-source voltage) thereof is kept substantially constant independently of the supply voltage, connected in series thereto. As shown, the gate of the transistor T1 is biased at a constant voltage Vref, which may be obtained by means of a conventional reference constant voltage generator (not shown in FIG. 2), thus setting a certain reference current Iref through the transistor T1, which current may conveniently be about 1 microamperes.

By supposing to power the circuit, the HV output voltage of the circuit will be initially equal to the supply voltage VCC less the voltage drop across the five diode-connected transistors of the five stages of the voltage multiplier circuit respectively. If the chain of diode-connected transistors which regulates the output voltage has, for example, a total threshold voltage of 12 V, until the output voltage HV reaches such a value no current will flow through the regulation chain, and therefore the voltage HV–REG across the transistor T1 will be substantially at ground potential because of the relatively small current: Iref, imposed by the current generator formed by the transistor T1. The HV–REG signal is on the other hand fed to the input of an inverter 1 and the corresponding output signal of the inverter 1 is fed to the input of a Schmitt trigger the output signal of which is fed to the enable terminal C of the ring oscillator (i.e. of the NOR gate which substitutes one of the inverters which functionally form a ring oscillator).

Therefore, when the HV–REG signal is substantially at ground potential, equally at ground potential will be the STOPOSC signal produced at the output of the Schmitt trigger and the ring oscillator will be free of oscillate with a frequency which, as already said, may depend upon the value of the supply voltage VCC.

After a certain number of oscillations depending from the value of VCC, i.e., from the amplitude of the driving signals phi 1 and phi 2 and from the threshold voltage of the diode-connected transistors of the various stages of the voltage multiplier, the output HV voltage of the voltage multiplier will reach the threshold voltage determined by the regulating chain of diode-connected transistors, and through the chain the current which is not absorbed by the circuits fed with the high voltage HV will be discharged to ground. As soon as the value of such a current discharged to ground becomes higher than the current imposed by the current generator T1, i.e., Iref, the potential of the node HV–REG will start to rise and eventually, through the suitably unbalanced inverter 1 and the Schmitt trigger which regenerates the phase of the signal and amplifies it to a full logic value, the STOPOSC signal will stop the oscillator. At this point, the voltage multiplier circuit may no longer transfer electric charge to the output capacitor COUT, which begins to discharge and the output voltage HV slowly drops until the regulating chain is no longer capable of letting discharge current through because the voltage across the chain has fallen below the total threshold voltage thereof. The starting situation wherein the HV–REG signal assumes a ground potential and the oscillator is again free to oscillate is therefore re-established. In this situation, just *a* few oscillations may be sufficient to [rise] *raise* the output voltage HV again to the value at which the regulating circuit intervenes again to stop the oscillator and so on, until, in the limit, even a single oscillation will suffice.

At steady state, with a constant current drawn by the circuits powered through the HV output terminal of the circuit, there will be a resulting controlled oscillation frequency which will be as high as large is the current drawn and the whole system will provide substantially only this current without any substantial waste of current through the output voltage regulating chain with the exception of a limit current of the same order of the reference current Iref of about 1 microamperes, which is determined by the current generator formed by the transistor T1. In this way the total power consumption which notably depends strongly on the frequency of the oscillator, will be effectively reduced in accordance with the set objective.

As it will be apparent to the skilled technician, the use of a Schmitt trigger within the ring oscillator frequency regulation network, as shown in the embodiment of FIG. 2, is not strictly necessary, being the Schmitt trigger easily replaceable by any amplifying stage capable of producing through an output terminal thereof a signal of a desired level in function of the output signal of the first inverter 1 and regenerated in term of phase in respect of said HV–REG signal.

By the term "diode" often used in the specification and in the claims for describing the elements composing said regulating chain, it is intended to indicate any structure functionally equivalent to a diode.

What we claim is:

[1. A circuit for regulating the output voltage of a system for multiplying a supply voltage comprising a multistage voltage multiplier circuit, wherein each stage is formed essentially by a diode and a capacitor connected so as to transfer electric charge in a single direction from a supply terminal to an output capacitor to which an output terminal of the voltage multiplier is connected, an oscillator capable of generating two driving signals with a 180° phase difference between each other for driving the charge transfer from any stage to a successive stage of said multistage multiplier and having an input terminal (C) for applying an oscillation stop signal, and a chain of diodes or of diode-equivalent structures functionally connected in series between said output terminal of the voltage multiplier and ground for regulating the output voltage, characterized by comprising a transistor operating as a current generator connected between the last one of said diodes of said output voltage regulating chain of diodes and ground, having a base biased at a constant voltage (Vref) suitable to generate a constant reference current (Iref) through the transistor, a first signal (HV–REG) being developed across said transistor when said chain of series connected diodes is traversed by a discharge current greater than said current (Iref) imposed by said transistor operating as a current generator upon the rising of the output voltage of the voltage multiplier above the sum of individual threshold voltages of said regulating, series-connected diodes;

an inverter having a preset triggering threshold and capable of generating a second signal opposite in phase in respect to said (HV–REG) first signal when the latter, fed to an input of the inverter, becomes greater than the preset threshold thereof;

an amplifying stage capable of producing a third signal (STOPOSC) in phase with said first signal (HV–REG) in function of said output signal of said inverter which is fed to an input of the amplifying stage;

said third signal (STOPOSC) being fed to said input terminal (C) for a stop signal of said oscillator for interrupting oscillation thereof until said series-connected diode regulating chain is being traversed by a current greater than the current (Iref) imposed by said transistor operating as a current generator by a certain value which is determined by the pre-set triggering threshold of said inverter.]

[2. The circuit according to claim 1, wherein said amplifying stage is a Schmitt trigger.]

*3. A circuit for producing a regulated output voltage, comprising:*

*a voltage multiplier;*

*an oscillator for driving said voltage multiplier and having a terminal for receiving an oscillation interrupt signal;*

*a voltage regulator;*

*a constant current generator,*

*said voltage regulator being connected to an output terminal of the voltage multiplier, and said constant current generator being connected between the voltage regulator and ground, wherein a first signal is developed across said constant current generator;*

*a trigger circuit having a preset triggering threshold for generating an oscillation interrupt signal when said first signal becomes greater than the preset triggering threshold;*

*said oscillation interrupt signal being connected to said oscillator terminal to interrupt oscillation of the oscillator until the first signal on said constant current generator falls below the preset triggering threshold of said trigger circuit.*

*4. The circuit of claim 3 wherein said constant current generator is a transistor.*

*5. The circuit of claim 4 wherein said transistor is a field effect transistor having a source-drain current path connected between said voltage regulator and ground, and a gate connected to a reference potential.*

*6. The circuit of claim 3 wherein said trigger circuit comprises an inverter and a Schmitt trigger.*

*7. The circuit of claim 6 wherein said trigger circuit regenerates the phase of said first signal in said oscillation interrupt signal.*

*8. The circuit of claim 3 wherein said voltage regulator comprises a chain of diodes.*

*9. The circuit of claim 8 wherein said diodes are diode-connected transistors.*

*10. The circuit of claim 9 wherein said diode-connected transistors are p-channel transistors.*

*11. The circuit of claim 9 wherein said diode-connected transistors are Zener diodes.*

*12. The circuit of claim 9 wherein said diode-connected transistors are parasitic transistors.*

*13. The circuit of claim 3 wherein said voltage multiplier is a multistage circuit each comprising a diode and capacitor connected to transfer a charge from an input to an output, and wherein said oscillator provides a plurality of phased driving signals connected to drive the charge through the stages of said voltage multiplier.*

*14. The circuit of claim 3 wherein said oscillator is a ring oscillator.*

*15. The circuit of claim 14 wherein said ring oscillator comprises two outputs phased 180° apart.*

*16. The circuit of claim 14 wherein said ring oscillator comprises a NOR gate providing an invertor function, an input of said NOR gate providing said terminal for receiving an oscillation interrupt signal.*

* * * * *